(12) United States Patent
Tang et al.

(10) Patent No.: US 11,329,639 B1
(45) Date of Patent: May 10, 2022

(54) DELAY CELL FOR QUADRATURE CLOCK GENERATION WITH INSENSITIVITY TO PVT VARIATION AND EQUAL RISING/FALLING EDGES

(71) Applicant: QUALCOMM Incorporated, San Diego, CA (US)

(72) Inventors: Chiu Keung Tang, San Diego, CA (US); Zhiqin Chen, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 17/212,366

(22) Filed: Mar. 25, 2021

(51) Int. Cl.
  *H03K 5/13* (2014.01)
  *H03K 5/156* (2006.01)
  *H03K 5/00* (2006.01)

(52) U.S. Cl.
  CPC ............ *H03K 5/13* (2013.01); *H03K 5/1565* (2013.01); *H03K 2005/00052* (2013.01)

(58) Field of Classification Search
  CPC .. H03K 5/01; H03K 5/04; H03K 5/13; H03K 5/131; H03K 5/133; H03K 5/135; H03K 3/0315; H03K 3/0231; H03K 3/0322; H03K 17/164; H03K 7/08; H03K 2005/00052

USPC ................................. 327/172, 173, 174, 175
See application file for complete search history.

(56) References Cited

U.S. PATENT DOCUMENTS

| | | | | |
|---|---|---|---|---|
| 6,069,511 A | * | 5/2000 | Mohan | H03K 5/13 327/170 |
| 6,377,095 B1 | * | 4/2002 | Kuo | H04L 25/0276 327/170 |
| 6,861,877 B2 | * | 3/2005 | Shiah | H03K 5/04 327/176 |
| 2006/0214688 A1 | * | 9/2006 | Pan | H03K 17/145 326/83 |

* cited by examiner

*Primary Examiner* — John W Poos
(74) *Attorney, Agent, or Firm* — Chui-kiu Teresa Wong

(57) ABSTRACT

A novel delay circuit for quadrature clock generation with insensitivity to process, voltage, temperature (PVT) variations and equal rising/falling edges is disclosed. In one implementation, the delay circuit includes a first N-substage having a sinking current source, configured to receive an input signal and to generate a rising edge of an output signal of the delay circuit, wherein the output signal is a delayed version of the input signal. The delay circuit further includes a first P-substage having a sourcing current source, configured to receive the input signal and to generate a falling edge of the output signal, where the sinking current source and the sourcing current source are variable in response to respective ones of a plurality of bias voltages.

17 Claims, 7 Drawing Sheets

DELAY CELL FOR QUADRATURE CLOCK GENERATION WITH INSENSITIVITY TO PVT VARIATION AND EQUAL RISING/FALLING EDGES

FIELD OF DISCLOSURE

Aspects of the present disclosure relate generally to delay circuits, and more particularly to delay circuits that are insensitive to process, voltage, and temperature (PVT) variations.

BACKGROUND

An integrated circuit (IC) may include a plurality of delay elements or delay circuits to perform various operations. For example, delay elements may be used to time align two or more signals, such as a data signal to a corresponding clock signal, and/or vice-versa. Delay elements may also be used in input/output (I/O) interface to generate one or more clock signals to sample incoming data. The performance of such delay elements is of interest in the present disclosure.

SUMMARY OF THE DISCLOSURE

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a delay circuit, comprising: a first N-sub stage having a sinking current source, configured to receive an input signal and to generate a rising edge of an output signal of the delay circuit, wherein the output signal is a delayed version of the input signal; and a first P-substage having a sourcing current source, configured to receive the input signal and to generate a falling edge of the output signal, where the sinking current source and the sourcing current source are variable in response to respective ones of a plurality of bias voltages.

According to one aspect of the disclosure, the delay circuit may further include a duty cycle correction module coupled to the first N-substage and the first P-substage, configured to adjust only one of the rising edge and the falling edge of the output signal to correct duty cycle distortion of the output signal.

According to a further aspect of the disclosure, the duty cycle correction module comprises: a set of p-type metal oxide semiconductor devices (pMOS's), each having a drain, a gate, and a source, the drain coupled to the first P-substage, the source coupled to a voltage supply (VDD), and the gate configured to receive a first one of the plurality of bias voltages (Vbp); and a set of n-type metal oxide semiconductor devices (nMOS's), each having a drain, a gate, and a source, the drain coupled to the first N-substage, the source coupled to ground, and the gate configured to receive a second one of the plurality of bias voltages (Vbn).

According to a further aspect of the disclosure, the set of pMOS's of the duty cycle correction module is configured to be tunable to adjust the falling edge of the output signal, and the set of nMOS's of the duty cycle correction module is configured to remain constant.

According to another aspect of the disclosure, the set of nMOS's of the duty cycle correction module is configured to be tunable to adjust the rising edge of the output signal, and the set of pMOS's of the duty cycle correction module is configured to remain constant.

According to one aspect of the disclosure, the delay circuit further includes a second N-substage having a first input coupled to the first P-substage, and an output coupled to an output of the delay circuit to provide the falling edge of the output signal of the delay circuit; and a second P-substage having a first input coupled to the first N-substage, and an output coupled to the output of the delay circuit to provide the rising edge of the output signal of the delay circuit.

According to a further aspect of the disclosure, the second P-substage includes an output pMOS having a source, a gate, and a drain, the source of the output pMOS coupled to a voltage supply (VDD), the drain coupled to an output of the delay circuit, and the gate coupled to the first N-substage; and a compensation NMOS having a gate, a source, and a drain, the drain coupled to the voltage supply (VDD), the source coupled to the output of the delay circuit, and the gate coupled to a first tracking module.

According to a further aspect of the disclosure, the first tracking module includes a second sourcing current source, substantially similar to the sourcing current source of the first P-substage, and an nMOS having a gate, a source, and a drain, the source coupled to ground, the drain coupled to the second sourcing current source, and the gate configured to receive a complementary version of the input signal.

According to a further aspect of the disclosure, the second N-substage includes an output nMOS having a source, a gate, and a drain, the source coupled to ground, the drain coupled to the output of the delay circuit, and the gate coupled to the first P-substage; and a compensation pMOS having a gate, a source, and a drain, the drain coupled to ground, the source coupled to the output of the delay circuit, and the gate coupled to a second tracking module.

According to a further aspect of the disclosure, the second tracking module includes a second sinking current source, substantially similar to the sinking current source of the first N-substage, and a pMOS having a gate, a source, and a drain, the source coupled to the voltage supply (VDD), the drain coupled to the second sinking current source, and the gate configured to receive the complementary version of the input signal.

According to a further aspect of the disclosure, the plurality of bias voltages are generated from a bandgap reference current.

According to one aspect of the disclosure, a system on a chip (SoC) includes a processing module; and an input interface, coupled to the processing module, configured to receive input signals from a source external to the SoC, the input interface comprising a quadrature clock generator, the quadrature clock generator comprising a delay circuit as recited in any of the above paragraphs.

According to a further aspect of the disclosure, the quadrature clock generator further comprises: a single end to differential converter coupled to the delay circuit to receive the delayed version of the clock signal and to generate a pair of complementary clock signals based on the delayed version of the clock signal; and a phase interpolator coupled to the single end to differential converter to receive the pair of complementary clock signals.

According to one aspect of the disclosure, a method to generate a delayed version of an input signal includes generating a rising edge of an output signal from the input signal using a first N-substage having a sinking current source, wherein the output signal is the delayed version of the input signal; and generating a falling edge of the output signal using a first P-substage having a sourcing current source, where the sinking current source and the sourcing current source are variable in response to respective ones of a plurality of bias voltages.

According to a further aspect of the disclosure, the method further includes adjusting only one of the rising edge and the falling edge of the output signal to correct duty cycle distortion of the output signal.

According to a further aspect of the disclosure, the method further includes providing the falling edge of the output signal using a second N-substage, the second N-substage having a first input coupled to the first P-substage, and an output coupled to an output of the delay circuit; and providing the rising edge of the output signal using a second P-substage, the second P-substage having a first input coupled to the first N-substage, and an output coupled to the output of the delay circuit.

According to a further aspect of the disclosure, the second P-substage comprises an output PMOS having a source, a gate, and a drain, the source of the output PMOS coupled to a voltage supply (VDD), the drain coupled to an output of the delay circuit, and the gate coupled to the first N-substage; and the method further comprises: providing cross-skew compensation to the rising edge of the output signal using a compensation NMOS driven by a first tracking module, wherein the compensation NMOS has a gate, a source, and a drain, the drain coupled to the voltage supply (VDD), the source coupled to the output of the delay circuit, and the gate coupled to the first tracking module.

According to a further aspect of the disclosure, the second N-substage comprises an output NMOS having a source, a gate, and a drain, the source of the output NMOS coupled to ground, the drain coupled to the output of the delay circuit, and the gate coupled to the first P-substage; and the method further comprises: providing cross-skew compensation to the falling edge of the output signal using a compensation PMOS driven by a second tracking module, wherein the compensation PMOS has a gate, a source, and a drain, the drain coupled to the ground, the source coupled to the output of the delay circuit, and the gate coupled to the second tracking module.

According to a further aspect of the disclosure, the method further includes generating the plurality of bias voltages from a bandgap reference current source.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
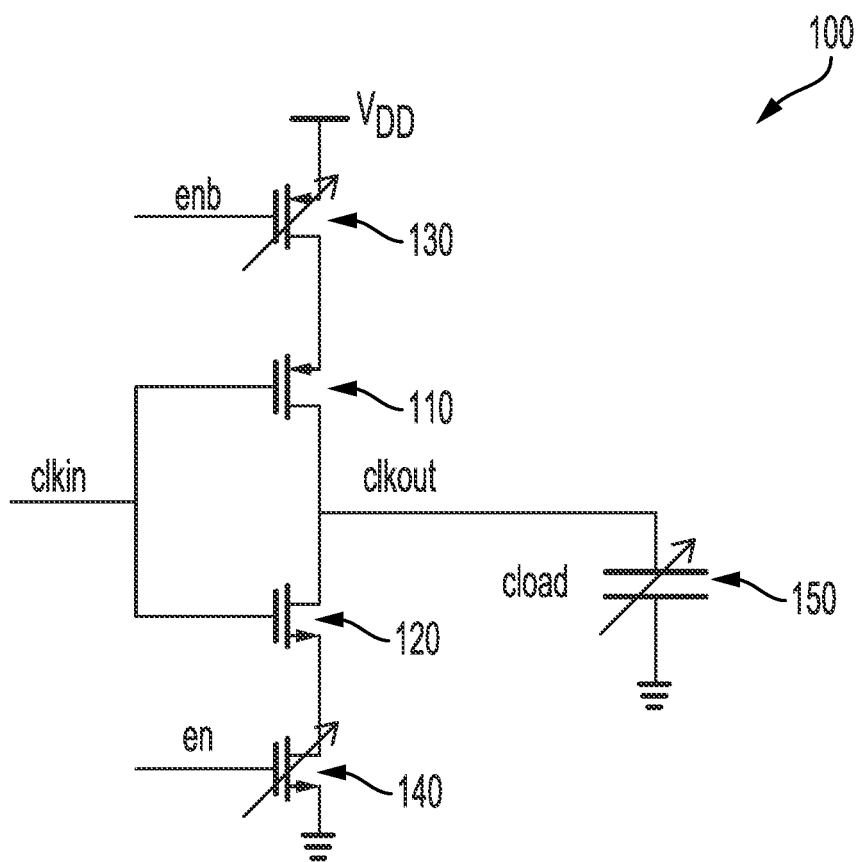
FIG. 1 shows an exemplary conventional delay circuit.

Delay circuits have been widely used in semiconductor circuits in many different applications. Conventional delay circuits typically include a simple inverter-based circuit and delay adjustment is achieved by capacitance tuning and/or device sizing. An exemplary conventional inverter-based delay circuit 100 is shown in FIG. 1. The delay circuit 100 includes a p-type metal oxide semiconductor transistor (pMOS) 110, another pMOS 130, an n-type metal oxide semiconductor transistor (nMOS) 120, another nMOS 140, and an adjustable load capacitor 150. Each of the pMOS's 110, 130 and nMOS's 120, 140 has a source, a gate, and a drain. The gates of the pMOS 110 and the nMOS 120 are coupled together and configured to receive an input signal clkin to the delay circuit 100. The drains of the pMOS 110 and the nMOS 120 are coupled together and configured to output an output signal clkout of the delay circuit 100. The load capacitor cload 150 is coupled between the drains of the pMOS 110 and nMOS 120 (i.e., the output of the delay circuit 100) and ground. The source of the pMOS 130 is coupled to a power supply or voltage supply, VDD, and the drain of the pMOS 130 is coupled to the source of the pMOS 110. The gate of the pMOS 130 is configured to receive a complementary version of an enable signal, enb. The pMOS 130 is tunable and is configured as a current source. The source of the nMOS 140 is coupled to ground, and the drain of the nMOS 140 is coupled to the source of the nMOS 120. The gate of the nMOS 140 is configured to receive the enable signal, en. The nMOS 140 is tunable and is configured as a current sink. The current source pMOS 130 and the current sink nMOS 140 receive enb and en, respectively, at their respective gates to set a particular delay of the delay circuit 100. For example, the tunable pMOS 130 can be implemented using a set of pMOS's coupled in parallel between the source of pMOS 110 and VDD, where pMOS 130 is tuned by turning on (or activating) a selected number of the pMOS's. By turning on (or activating) a selected number of the pMOS's, the effective size of pMOS 130 can be adjusted. Likewise, the tunable nMOS 140 can be implemented using a set of nMOS's coupled in parallel between the source of nMOS 120 and ground, where nMOS 140 is tuned by turning on (or activating) a selected number of the nMOS's. By turning on (or activating) a selected number of the nMOS's, the effective size of nMOS 140 can be adjusted. In other words, the delay of the delay circuit 100 can be adjusted by sizing the pMOS 130 and/or the nMOS 140.

In addition to the current sink nMOS 140 and current source pMOS 130, the delay provided by the delay circuit 100 is also proportional to the load capacitance cload 150. Therefore, delay of the delay circuit 100 can also be adjusted by adjusting cload 150. In some implementations, cload 150 is implemented using a set of capacitors coupled in parallel between the output of the delay circuit 100 and ground, where each of the capacitors can be turned on/off by a switch.

Although the inverter-based delay circuit 100 is relatively simple, the delay circuit 100 may be susceptible to process, voltage, and/or temperature (PVT) variations, causing changes to the delay. Thus, the delay circuit 100 may not be suitable for more complex semiconductor circuits in many applications today that demand greater insensitivity across PVT corners. This is further discussed below with reference to an exemplary electronic device 200 in FIG. 2.

Figure 2:
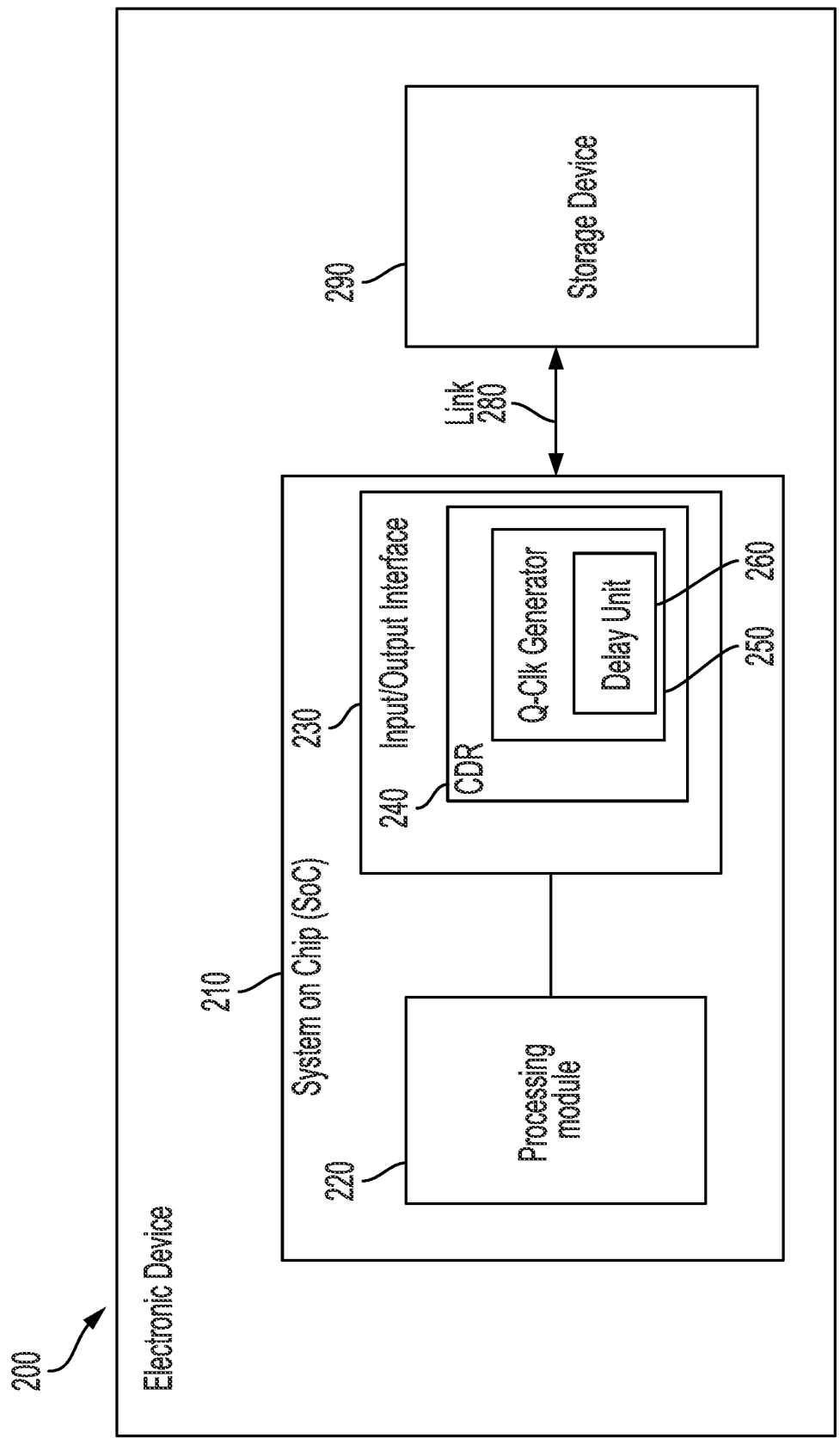
FIG. 2 shows one implementation of a system on a chip (SoC).

Today, electronic devices are used in a wide variety of applications, such as automobiles, computing systems (e.g., laptops, desktops, servers, etc.), mobile and/or wearable devices (e.g., smartphones, smartwatches, etc.), Internet of Things (IoT) devices, etc. An electronic device typically includes one or more semiconductor chips, such as, for example, a system on a chip (SoC), storage devices (e.g., flash memories), etc. As performance requirements are driven higher and higher, there is a need to support high speed data link between semiconductor chips within an electronic device. FIG. 2 shows one implementation of an electronic device according to some aspects of the disclosure. The electronic device 200 includes a SoC 210 and a storage device 290, communicatively coupled to each other via a high speed link 280. A data stream, with clock signals embedded, can be transmitted between the storage device 290 and the SoC 210 via the high speed link 280. For example, the storage device 290 can include a flash memory (e.g., NAND flash memory), and the high speed link 280 can be a serializer/deserializer (SerDes) link, such as an Universal Flash Storage (UFS) compliant link.

In some implementations, the SoC 210 includes a processing module 220 and an input/output (I/O) interface 230. It should be appreciated that the SoC 210 can include more components or modules than those illustrated in FIG. 2. The processing module 220 can be an application processor (having multiple cores), a graphics processing unit (GPU), etc. The I/O interface 230 can include a clock data recovery (CDR) module 240, a quadrature clock generator 250, and a delay unit 260. Generally speaking, the I/O interface 230 is configured to send and/or receive data stream via the high speed link 280 to/from another semiconductor chip (e.g., the storage device 290) external to the SoC 210. It should be appreciated that there can be more than one semiconductor chip communicatively coupled to the I/O interface 230 via the high speed link 280. But to avoid obscuring the illustration, only one storage device 290 is shown in FIG. 2.

According to some aspects of the disclosure, the I/O interface 230 includes the CDR module 240, which is configured to recover a clock signal in the data stream received via the high speed link 280 for further processing of the data in the data stream. In some implementations, the CDR module 240 includes the quadrature clock generator 250, which is configured to generate four (4) clock signals from the clock signal recovered. Furthermore, the four clock signals are typically in phase with respect to each other (i.e., every two clock signals are 90 degrees (90°) apart from each other). As shown in FIG. 2, the quadrature clock generator 250 includes a delay unit 260. Using the delay unit 260, the quadrature clock generator 250 can generate four clock signals from the recovered clock signal. More details of the quadrature clock generator 250 and the delay unit 260 according to some aspects of the disclosure are further discussed below with reference to FIGS. 3-7.

Figure 3:
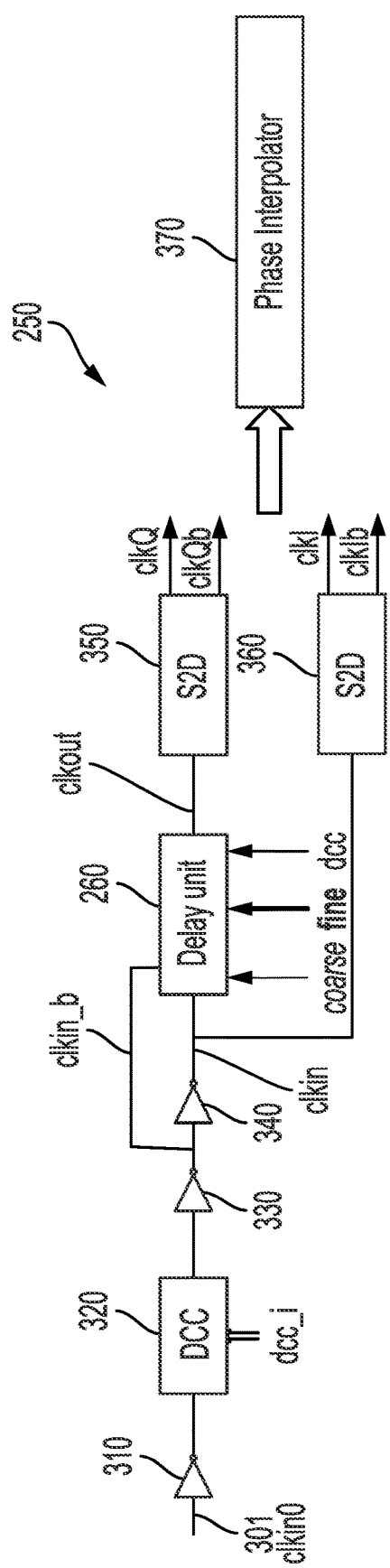
FIG. 3 shows one implementation of a quadrature clock generator.

FIG. 3 shows one implementation of the quadrature clock generator 250. The quadrature clock generator 250 includes an input buffer 310, a duty cycle correction (DCC) module 320, a first inverter 330, a second inverter 340, the delay unit 260, a first single-ended to differential (S2D) converter 350, a second S2D converter 360, and a phase interpolator 370. The input buffer 310 has an input and an output. The output of the input buffer 310 is coupled to an input of the DCC module 320. The DCC module 320 has an additional set of one or more inputs to receive a DCC code dcc 1. Further, the DCC module 320 has an output, which is coupled to an input of the first inverter 330. An output of the first inverter 330 is coupled to an input of the second inverter 340. The first and the second inverters 330 and 340 are coupled in series. An output of the second inverter 340 is coupled to an input of the delay unit 260 and an input of the second S2D converter 360. The delay unit 260 has an additional set of inputs to receive three sets of code, namely, coarse, fine, and dcc. The delay unit 260 can use these three sets of code to tune the delay and/or to correct the duty cycle of the output signal of the delay unit 260. Details of some implementations of the delay unit 260 will be discussed further below. An output of the delay unit 260 is coupled to an input of the first S2D converter 350. Each of the S2D converters 350 and 360 has two outputs.

During operation, the input buffer 310 receives an input clock signal clkin0 301. As discussed above, clkin0 301 can be the clock signal recovered from an input data stream received at the I/O interface 230. The input buffer 310 forwards clkin0 301 to the DCC module 320, which is configured to correct the duty cycle distortion of clkin0 301, if any. The DCC module 320 then outputs the duty cycle corrected clock signal to the first and second inverters 330 and 340, which are configured as a buffer. The inverter 340 outputs the duty cycle corrected clock signal clkin to the delay unit 260 and the second S2D converter 360. Likewise, the inverter 330 outputs a complementary version of clkin, i.e., clkin_b, to the delay unit 260. The delay unit 260 generates a delayed version of clkin and outputs the delayed version of clkin to the first S2D converter 350. The delayed version of clkin is 90° apart from clkin. The first S2D converter 350 is configured to generate a pair of differential clock signals (clkQ and clkQb) from the delayed version of clkin. This pair of differential clock signals may be referred to as the Q clock. Note that clkQb is the complementary version of clkQ, i.e., clkQ and clkQb are 180° apart from each other. Likewise, the second S2D converter 360 is configured to generate a pair of differential clock signals (clkI and clkIb) from clkin. This pair of differential clock signals may be referred to as the I clock. Note that clkIb is the complementary version of clkI, i.e., clkI and clkIb are 180° apart from each other. As such, the four clock signals generated, clkQ, clkQb, clkI and clkIb, are 90° apart from each other. Thus, these four clock signals are also referred to as quadrature clock signals. Finally, the four quadrature clock signals are input to the phase interpolator 370. The phase interpolator 370 may rotate an in-phase (I) and quadrature (Q) clock phase in N number of steps, where N is an integer, to properly align an in-phase clock with the center of a data eye of the data stream for sensing or detection of data signals in the data stream.

As mentioned above, the performance requirement is driven higher and higher. For example, a new generation of UFS physical layer (PHY) standard (Generation 5) requires clock signal to be at 10 GHz and 12.5 GHz to support half-rate receiver architecture. In general, the phase interpolator 370 requires accurate quadrature clock phases to function properly for clock recovery. The quadrature clock generator 250 has to generate these quadrature clock signals with precise phase relationship. Specifically, the quadrature clock generator 250 has to support both 10 GHz and 12.5 GHz, without any clock division, in order to support UFS PHY standard (Generation 5). Furthermore, the quadrature clock generator 250 has to be low power and flexible for process scaling. The quadrature clock generator 250 also has to be robust and insensitive to PVT variations in order to ease design complexity.

The delay unit 260 is a critical component in the quadrature clock generator 250 because the delay unit 260 determines the phase relationship between I clock and Q clock. A conventional delay unit can be implemented using the CMOS inverter-based circuit 100 illustrated in FIG. 1. The delay adjustment of the CMOS inverter-based circuit can be achieved by modifying the load impedance or capacitance. However, the delay generated using this conventional delay circuit 100 is very sensitive to PVT variations, and thus, requires larger calibration range to cover PVT variations. Besides, there may be PN mismatch of the pMOS 110 and the nMOS 120 of the inverter 100, which results in unequal output rising and falling edges. Therefore, there is a need for a delay unit that is insensitive to PVT variations and provide substantially equal rising and falling edges in the output. Some implementations of a delay unit that meet the above needs are discussed below with reference to FIGS. 4-7.

Figure 4:
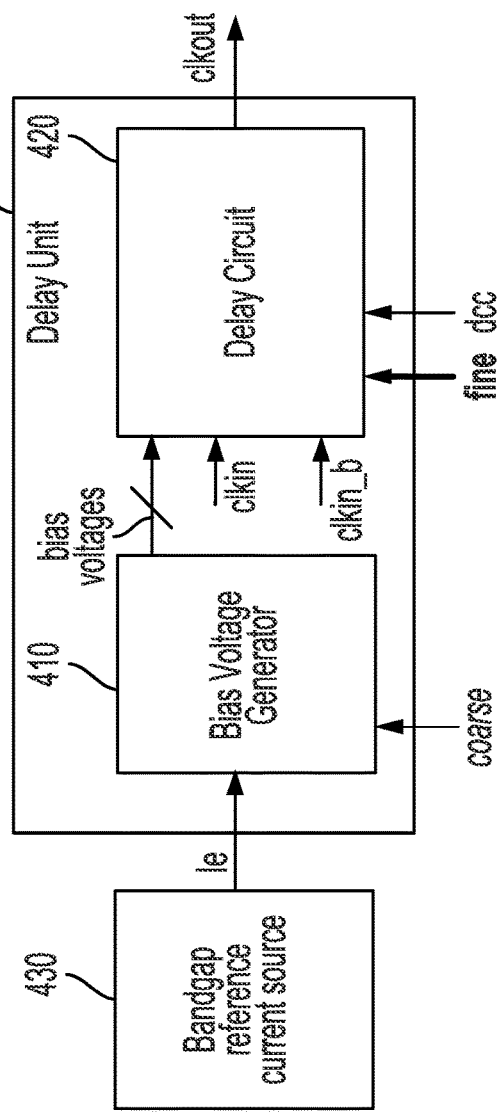
FIG. 4 shows one implementation of a delay unit according to some aspects of the disclosure.

FIG. 4 shows one implementation of the delay unit 260 according to some aspects of the disclosure. The delay unit 260 includes a bias voltage generator 410 and a delay circuit 420. The bias voltage generator 410 is configured to generate a set of bias voltages, which are input to the delay circuit 420. The delay circuit 420 is configured to receive an input signal, clkin, and its complementary signal, clkin_b; and to generate a delayed version of clkin, clkout. The delay unit 260 is coupled to a bandgap reference current source 430. The bandgap reference current source 430 provides a bandgap reference current (Ie) to the bias voltage generator 410. The bandgap reference current is substantially constant and insensitive to PVT variations in general. Using the bandgap reference current, the bias voltage generator 410 generates the set of bias voltages and provides the bias voltages to the delay circuit 420. The bias voltage generator 410 has a set of inputs configured to receive a code, coarse, which is used in generation of the bias voltages. Likewise, the delay circuit 420 has a set of inputs configured to receive a code, fine, which is used in generation of the output of the delay circuit 420, clkout. In addition, the delay circuit 420 can have an additional set of inputs configured to receive another code, dcc, which is used in duty cycle correction of clkout. More details of the delay circuit 420 and the bias voltage generator 410 are discussed below.

Figure 5:
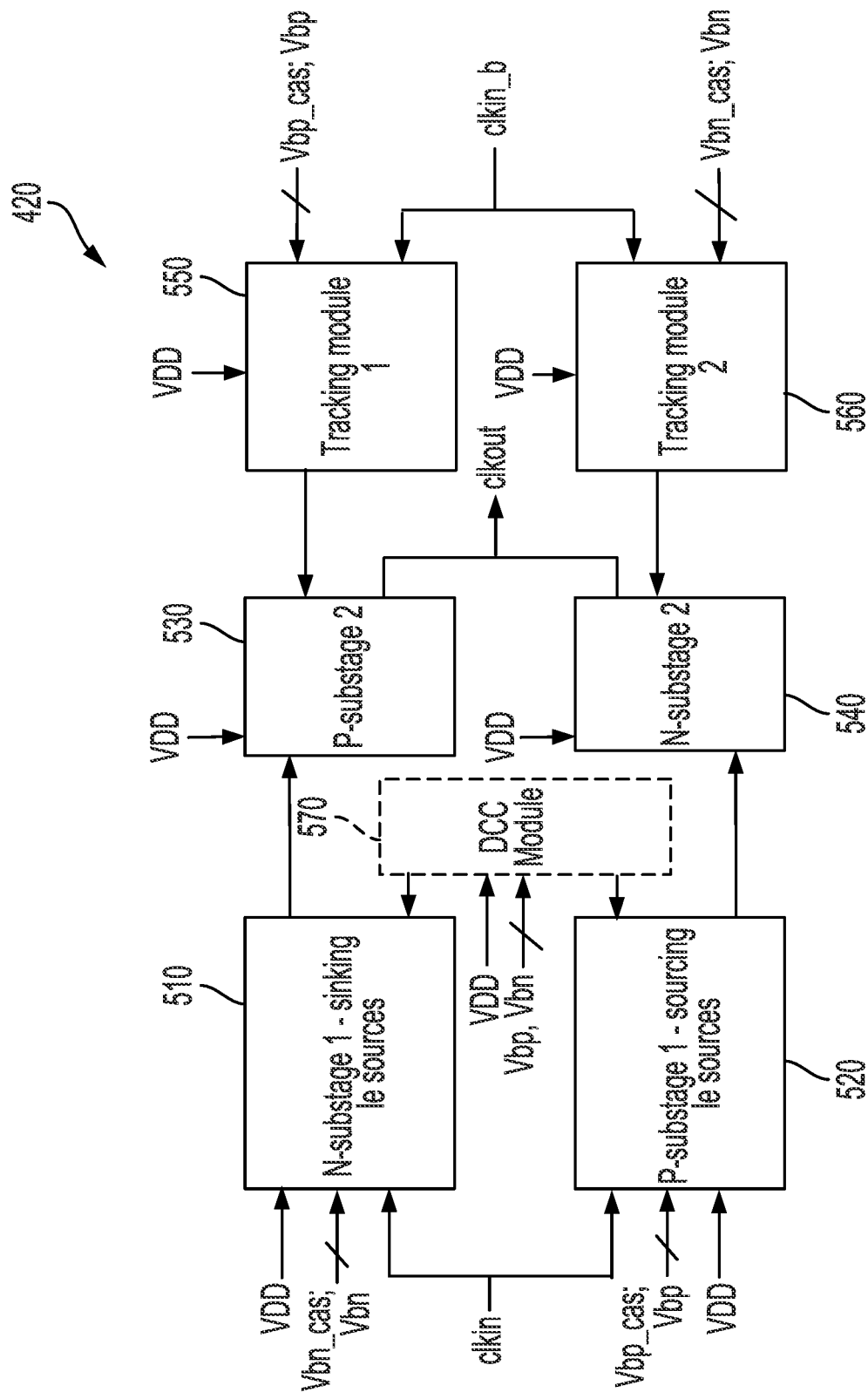
FIG. 5 shows one implementation of a delay circuit according to some aspects of the disclosure.

FIG. 5 shows one implementation of the delay circuit 420 according to some aspects of the disclosure. The delay circuit 420 includes a first N-substage 510 (a.k.a. N-substage 1), a first P-substage 520 (a.k.a. P-substage 1), a second P-substage 530 (a.k.a. P-substage 2), a second N-substage 540 (a.k.a. N-substage 2), a first tacking module 550 (a.k.a. tracking module 1), a second tracking module 560 (a.k.a. tracking module 2), and, optionally, a duty cycle correction (DCC) module 570, all of which are configured to receive a voltage supply VDD. Both N-substage 1 510 and P-substage 1 520 are configured to receive an input signal clkin. N-substage 1 510 is further configured to receive a set of bias voltages, namely, Vbn_cas and Vbn. P-substage 1 520 is further configured to receive another set of bias voltages, namely, Vbp_cas and Vbp. An output of N-substage 1 510 is coupled to an input of P-substage 2 530. Likewise, an output of P-substage 1 520 is coupled to an input of N-substage 2 540. P-substage 2 530 is further configured to receive an output from tracking module 1 550, while N-substage 2 540 is further configured to receive an output from tracking module 2 560. The output of P-substage 2 530 and the output of N-substage 2 540 are coupled together to provide an output signal of the delay circuit 420, clkout. Tracking module 1 550 is configured to receive a complementary version of the input signal clkin_b, and the bias voltages Vbp_cas and Vbp. Likewise, tracking module 2 560 is configured to receive the complementary version of the input signal clkin_b, and the bias voltages Vbn_cas and Vbn.

In some implementations, the delay circuit 420 further includes the duty cycle correction (DCC) module 570. Note that this DCC module 570 is distinct and separate from the DCC module 320 of the quadrature clock generator 250. Because the delay circuit 420 may introduce duty cycle distortion when generating a delayed version of the input signal clkin, the DCC module 570 integrated within the delay circuit 420 can be configured to correct or mitigate the duty cycle distortion introduced, if any. The DCC module 570 is configured to receive the bias voltages vbp and vbn from the bias voltage generator 410. The DCC module 570 has two outputs, one is coupled to N-substage 1 510, and the other is coupled to the N-substage 1 520. N-substage 1 510 and/or P-substage 1 520 can use the respective outputs from the DCC module 570 to tune or adjust the delay of clkin in order to compensate for, or mitigate, any duty cycle distortion introduced by the delay circuit 420. For example, N-substage 1 510 can adjust a rising edge of the output signal of the delay circuit 420, clkout, in response to the output of DCC module 570 in order to correct duty cycle distortion in clkout. Alternatively, P-substage 1 520 can adjust a falling edge of the output signal clkout in response to the output of DCC module 570 in order to correct duty cycle distortion in clkout. Note that only one of the rising or falling edges of clkout is adjusted in some implementations because it is unnecessary to adjust both the rising and falling edges of clkout to correct duty cycle distortion.

In some implementations, N-substage 1 510 has a sinking current source (not shown). The sinking current source can be biased by the bias voltages vbn_cas and vbn from the bias voltage generator 410. N-substage 1 510 is configured to receive the input signal clkin and to generate a rising edge of the output signal of the delay circuit 420, clkout. Specifically, the output of N-substage 1 510 is coupled to the input of P-substage 2 530 to drive P-substage 2 530 to generate a rising edge of clkout. More details of the operation of N-substage 1 510 and P-substage 2 530 will be discussed below with reference to FIG. 6.

In some implementations, P-substage 1 520 has a sourcing current source (not shown). The sourcing current source can be biased by the bias voltages vbp_cas and vbp from the bias voltage generator 410. P-substage 1 520 is configured to receive the input signal clkin and to generate a falling edge of the output signal of the delay circuit 420, clkout. Specifically, the output of P-substage 1 520 is coupled to the input of N-substage 2 540 to drive N-substage 2 540 to generate a falling edge of clkout. More details of the operation of P-substage 1 520 and N-substage 2 540 will be discussed below with reference to FIG. 6.

To accommodate (or to counter) PVT variations, the delay circuit 420 further includes tracking module 1 550 and tracking module 2 560 to track PVT variations and to provide compensation for PVT variations. Tracking module 1 550 is configured to receive a complementary version of the input signal, clkin_b. Furthermore, tracking module 1 550 has a sourcing current source (not shown), substantially similar to the sourcing current source of P-substage 1 520. Tracking module 1 550 is also configured to receive the bias voltages vbp_cas and vbp to bias its sourcing current source. Thus, the sourcing current source in tracking module 1 550 tracks the sourcing current source in P-substage 1 520, and in response to clkin_b, tracking module 1 550 can provide cross-skew compensation to the rising edge of clkout. More details of the tracking module 1 550 will be discussed below with reference to FIG. 6.

In addition to tracking module 1 550, the delay circuit 420 includes tracking module 2 560, which is also configured to receive a complementary version of the input signal, clkin_b. Furthermore, tracking module 2 560 has a sinking current source (not shown), substantially similar to the sinking current source of N-substage 1 510. Tracking module 2 560 is also configured to receive the bias voltages vbn_cas and vbn to bias its sinking current source. Thus, the sinking current source in tracking module 2 560 tracks the sinking current source in N-substage 1 510, and in response to clkin_b, tracking module 2 560 can provide cross-skew compensation to the falling edge of clkout. More details of the tracking module 2 560 will be discussed below with reference to FIG. 6.

Figure 6:
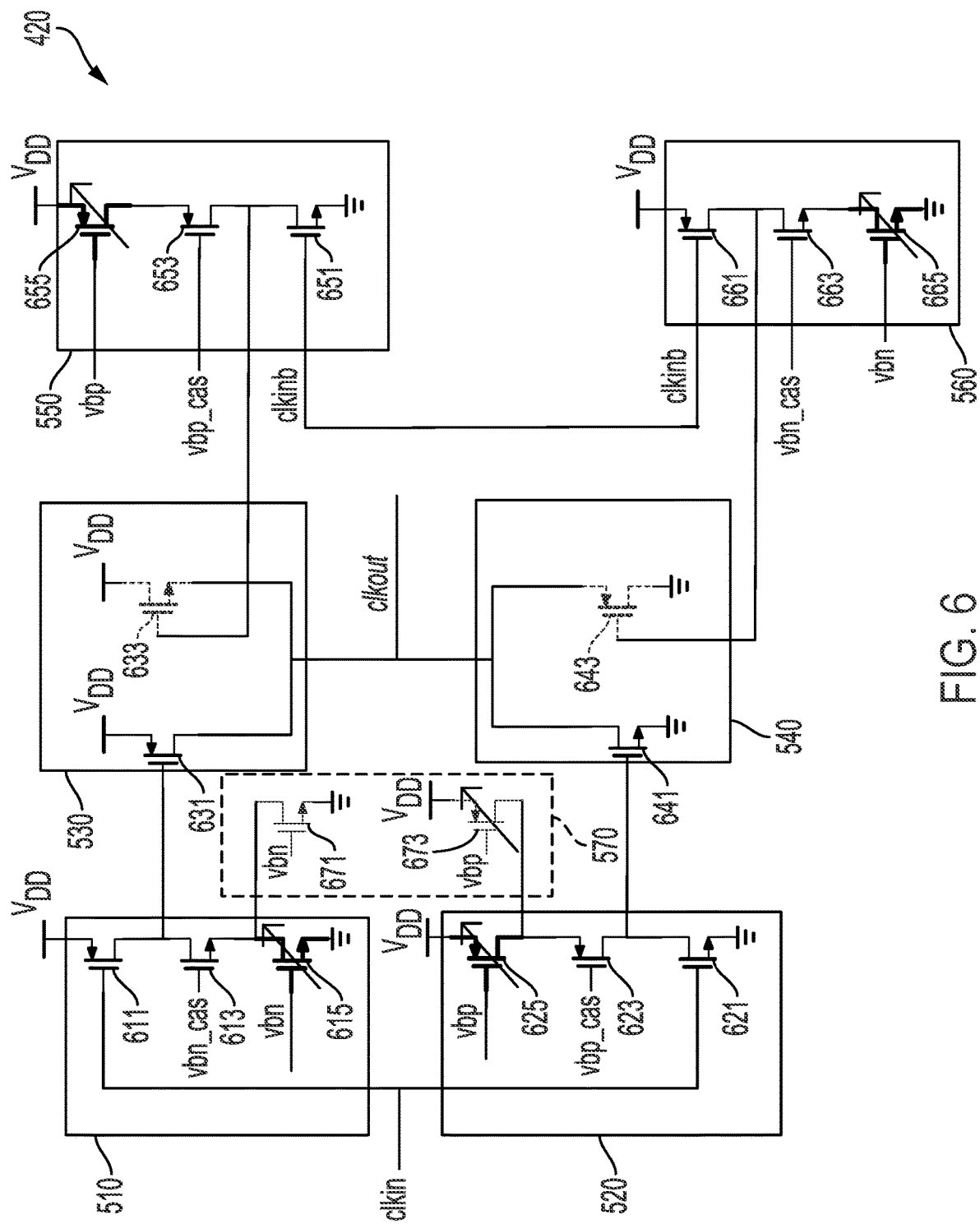
FIG. 6 shows one implementation of a delay circuit according to some aspects of the disclosure.

FIG. 6 shows one implementation of the delay circuit 420 according to some aspects of the disclosure. The delay circuit 420 in FIG. 6 includes a first N-substage 510 (a.k.a. N-substage 1), a first P-substage 520 (a.k.a. P-substage 1), a second P-substage 530 (a.k.a. P-substage 2), a second N-substage 540 (a.k.a. N-substage 2), a first tracking module 550 (a.k.a. tracking module 1), a second tracking module 560 (a.k.a. tracking module 2), and, optionally, a duty cycle correction (DCC) module 570, all of which are configured to receive a voltage supply VDD. Note that like reference numerals in FIGS. 5 and 6 refer to the same corresponding modules. Generally speaking, the first N-substage 510, the second P-substage 530, and the tracking module 1 550 in the top half of the delay circuit 420 are configured to generate a rising edge of the output signal of the delay circuit 420, clkout, while the first P-substage 520, the second N-substage 540, and the second tracking module 560 in the bottom half of the delay circuit 420 are configured to generate a falling edge of clkout.

Referring to FIG. 6, the first N-substage 510 includes a pMOS 611, an nMOS 613, and another nMOS 615, all of which are coupled to each other in series between VDD and ground. The input pMOS 611 has a source, a gate, and a drain, where the source is coupled to VDD and the gate is configured to receive an input signal clkin. The nMOS 613 has a source, a gate, and a drain, where the drain is coupled to the drain of the input pMOS 611 and the gate is configured to receive one of the bias voltages, vbn_cas. The nMOS 615 also has a source, a gate, and a drain, where the source is coupled to ground, the gate is configured to receive another bias voltage, vbn, and the drain is coupled to the source of the nMOS 613. In some implementations, the nMOS 615 is tunable. For example, the nMOS 615 can be implemented using a set of substantially similar nMOS's (not shown to avoid obscuring the drawing) coupled to each other in parallel between the source of the nMOS 613 and ground. The bias voltage vbn is applied to the gates of these nMOS's.

Furthermore, a selected number of these nMOS's can be turned on (or activated) based on the code, fine (shown in FIGS. 3 and 4), in order to tune the amount of total current flowing from the source of the nMOS 613 to ground. An output voltage of the first N-substage 510 is generated at the node between the drain of the input pMOS 611 and the drain of the nMOS 613. The output of the first N-substage 510 is coupled to an input of the second P-substage 530. The nMOS's 613 and 615 within the first N-substage 510 are driven at their gates by the bias voltages, vbn_cas and vbn, respectively, from a bias voltage generator (such as bias voltage generator 410 in FIG. 4), which generates the bias voltages from a bandgap reference current Ie. In response to vbn_cas and vbn, a current is generated to flow through the nMOS's 613 and 615 to ground, thus, creating a sinking current. Hence, the nMOS's 613 and 615 are also referred to as a sinking current source or a sinking Ie current source. During operation, vbn_cas and vbn can be tuned to adjust the rising edge of the delayed version of clkin (i.e., clkout). More details of the adjustment will be discussed further below.

In some implementations, the second P-substage 530 includes an output pMOS 631 and a compensation nMOS 633. The output pMOS 631 has a source, a gate, and a drain, where the source is coupled to VDD, the gate is coupled to the drains of the input pMOS 611 and nMOS 613 of the first N-substage 510, and the drain is configured to output the output of the delay circuit 420, clkout. The compensation nMOS 633 has a source, a gate, and a drain, where the drain is coupled to VDD, the source is coupled to the drain of the output pMOS 631, and the gate is coupled to an output of the first tracking module 550. During operation, the voltage generated at the node between the input pMOS 611 and the sinking current source of the first N-substage 510 drives the gate of the output pMOS 631, which generates clkout at its drain.

As shown in FIG. 6, one implementation of the first tracking module 550 includes a pMOS 655, another pMOS 653, and an nMOS 651, all coupled to each other in series between VDD and ground. Specifically, the pMOS 655 has a source, a drain, and a gate, where the source is coupled to VDD and the gate is configured to receive one of the bias voltages from a bias voltage generator (such as the bias voltage generator 410 in FIG. 4), vbp. The pMOS 653 also has a source, a drain, and a gate, where the source is coupled to the drain of the pMOS 655, and the gate is configured to receive another one of the bias voltages from the bias voltage generator, vbp_cas. The nMOS 651 has a drain, a source, and a gate, where the source is coupled to ground, the drain is coupled to the drain of the pMOS 653 to provide an output voltage to the second P-substage 530, and the gate is configured to receive a complementary version of the input signal clkin_b. The pMOS's 653 and 655 within the first tracking module 550 are driven at their gates by the bias voltages, vbp_cas and vbp, respectively. As mentioned above, the bias voltage generator generates the bias voltages from the bandgap reference current Ie. In response to vbp_cas and vbp, a current can be generated to flow through the pMOS's 655 and 653 from VDD down to the drain of nMOS 651, thus, creating a sourcing current. Hence, the pMOS's 653 and 655 are also referred to as a sourcing current source or a sourcing Ie current source. In some implementations, the pMOS 655 is tunable. For example, the pMOS 655 can be implemented using a set of substantially similar pMOS transistors (not shown to avoid obscuring the drawing) coupled to each other in parallel between the source of the pMOS 653 and VDD. The bias voltage vbp is applied to the gates of these pMOS's. Furthermore, a selected number of these pMOS's can be turned on (or activated) based on the code, fine (shown in FIG. 3), in order to tune the amount of total current flowing from VDD to the pMOS 653. Note that sourcing current source formed by pMOS's 653 and 655 is substantially similar to the sourcing current source formed by pMOS's 623 and 625 in the first P-substage 520 in some implementations. Thus, the sourcing current source in the first tracking module 550 can track the sourcing current source in the first P-substage 520 across different PVT conditions.

Referring back to the first tracking module 550, the drain of pMOS 653 is coupled to the gate of the compensation nMOS 633 in the second P-substage 530. During operation, the voltage at the drain of pMOS 653 drives the gate of the compensation nMOS 633, causing the compensation nMOS 633 to provide cross-skew corner compensation to the output pMOS 631, which is driven by the voltage at the node between the input pMOS 611 and the sinking current source within the first N-sub stage 510.

To further illustrate the operation of the delay circuit 420, consider the scenario when clkin transitions from low to high. The high voltage of clkin deactivates (or turns off) the input pMOS 611 to prevent current from flowing from VDD to the sinking current source (i.e., the nMOS's 613 and 615). The voltage at the node where the drains of the input pMOS 611 and nMOS 613 are coupled together is pulled down to low (or substantially ground). Since the gate of output pMOS 631 is coupled to the drains of the input pMOS 611 and nMOS 613, the output pMOS 631 is activated (or turned on), pulling up the voltage at the drain of output pMOS 631, which outputs clkout. As a result, clkout transitions to high to form a rising edge of clkout. Note that the bottom half of the delay circuit 420 (i.e., the first P-substage 520 and the second N-substage 540) is turned off when clkin transitions from low to high. The rising edge of the output signal clkout is generated by the first N-substage 510 and the second P-substage 530 operating together. As discussed above, the first tracking module 550 provides cross-skew corner compensation to the output pMOS 631. Specifically, in the current example, clkin_b transitions from high to low when clkin transitions from low to high. As mentioned above, the gate of nMOS 651 within the first tracking module 550 is configured to receive clkin_b. Thus, nMOS 651 is deactivated (or turned off) in response to clkin_b transitioning to low, blocking current flow from VDD through the pMOS's 655 and 653 to ground. Thus, the node at the drain of the pMOS 653 is pulled up to VDD. Since the gate of the compensation nMOS 633 is coupled to the drain of the pMOS 653, the compensation nMOS 633 is activated (or turned on) by VDD to provide cross-skew corner compensation to the output pMOS 631 when the rising edge of clkout is generated. Generation of the falling edge of clkout will be discussed below with reference to the bottom half of the delay circuit 420 in FIG. 6.

As shown in FIG. 6, the bottom half of the delay circuit 420 includes the first P-substage 520, the second N-substage 540, and the second tracking module 560. In some implementations, the first P-substage 520 includes an input nMOS 621, and two pMOS's 623 and 625, all coupled to each other in series between VDD and ground. The input nMOS 621 has a source, a gate, and a drain, where the source is coupled to ground and the gate is configured to receive the input signal clkin. The pMOS 623 has a source, a gate, and a drain, where the drain is coupled to the drain of the input nMOS 621 and the gate is configured to receive one of the bias voltages, vbp_cas. The pMOS 625 also has a source, a gate, and a drain, where the source is coupled to VDD, the gate is configured to receive another bias voltage, vbp, and the drain is coupled to the source of the pMOS 623. In some implementations, the pMOS 625 is tunable. For example, the pMOS 625 can be implemented using a set of substantially similar pMOS's (not shown to avoid obscuring the drawing) coupled to each other in parallel between the source of the pMOS 623 and VDD. The bias voltage vbp is applied to the gates of these pMOS's. Furthermore, a selected number of these pMOS's can be turned on (or activated) based on the code, fine (shown in FIGS. 3 and 4), in order to tune the amount of total current flowing from VDD to the source of the pMOS 623. An output voltage of the first P-substage 520 is generated at the node between the drain of the input nMOS 621 and the drain of the pMOS 623. The output of the first P-substage 520 is coupled to an input of the second N-substage 540. The pMOS's 623 and 625 within the first P-substage 520 are driven at their gates by the bias voltages, vbp_cas and vbp, respectively, from the bias voltage generator (such as bias voltage generator 410 in FIG. 4), which generates the bias voltages from a bandgap reference current Ie. In response to vbp_cas and vbp, a current is generated to flow from VDD through the pMOS's 623 and 625, thus, creating a sourcing current. Hence, the pMOS's 623 and 625 are also referred to as a sourcing current source or a sourcing Ie current source. During operation, vbp_cas and vbp can be tuned to adjust the falling edge of the delayed version of clkin (i.e., clkout). More details of the adjustment will be discussed further below.

In some implementations, the second N-substage 540 includes an output nMOS 641 and a compensation pMOS 643. The output nMOS 641 has a source, a gate, and a drain, where the source is coupled to ground, the gate is coupled to the drains of the input nMOS 621 and pMOS 623 of the first P-substage 520, and the drain is configured to output the output of the delay circuit 420, clkout. The compensation pMOS 643 has a source, a gate, and a drain, where the drain is coupled to ground, the source is coupled to the drain of the output nMOS 641, and the gate is coupled to an output of the second tracking module 560. During operation, the voltage generated at the node between the input nMOS 621 and the sourcing current source of the first P-substage 520 drives the gate of the output nMOS 641, which generates clkout at its drain.

As shown in FIG. 6, one implementation of the second tracking module 560 includes an nMOS 665, another nMOS 663, and a pMOS 661, all coupled to each other in series between VDD and ground. Specifically, the nMOS 665 has a source, a drain, and a gate, where the source is coupled to ground and the gate is configured to receive one of the bias voltages from the bias voltage generator (such as the bias voltage generator 410 in FIG. 4), vbn. The nMOS 663 also has a source, a drain, and a gate, where the source is coupled to the drain of the nMOS 665, and the gate is configured to receive another one of the bias voltages from the bias voltage generator, vbn_cas. The pMOS 661 has a drain, a source, and a gate, where the source is coupled to VDD, the drain is coupled to the drain of the nMOS 663 to provide an output voltage to the second N-substage 540, and the gate is configured to receive a complementary version of the input signal clkin_b. The nMOS's 663 and 665 within the second tracking module 560 are driven at their gates by the bias voltages, vbn_cas and vbn, respectively. As mentioned above, the bias voltage generator generates the bias voltages from the bandgap reference current Ie. In response to vbn_cas and vbn, a current can be allowed to flow through the nMOS's 665 and 663 from the drain of pMOS 661 to ground, thus, creating a sinking current. Hence, the nMOS's 663 and 665 are also referred to as a sinking current source or a sourcing Ie current source. In some implementations, the nMOS 665 is tunable. For example, the nMOS 665 can be implemented using a set of substantially similar nMOS transistors (not shown to avoid obscuring the drawing) coupled to each other in parallel between the source of the nMOS 653 and ground. The bias voltage vbn is applied to the gates of these nMOS's. Furthermore, a selected number of these nMOS's can be turned on (or activated) based on the code, fine (shown in FIGS. 3 and 4), in order to tune the amount of total current flowing from the pMOS 663 to ground. Note that sinking current source formed by nMOS's 663 and 665 is substantially similar to the sinking current source formed by nMOS's 613 and 615 in the first N-substage 510 in some implementations. Thus, the sinking current source in the second tracking module 560 can track the sinking current source in the first N-substage 510 across different PVT conditions.

Referring back to the second tracking module 560, the drain of nMOS 663 is coupled to the gate of the compensation pMOS 643 in the second N-substage 540. During operation, the voltage at the drain of pMOS 663 drives the gate of the compensation pMOS 643, causing the compensation pMOS 643 to provide cross-skew corner compensation to the output nMOS 641, which is driven by the voltage at the node between the input nMOS 621 and the sourcing current source within the first P-substage 520.

To further illustrate the operation of the delay circuit 420, consider the scenario when clkin transitions from high to low. The low voltage of clkin deactivates (or turns off) the input nMOS 621 to prevent current from flowing from the sourcing current source (i.e., the pMOS's 623 and 625) to ground. The voltage at the node where the drains of the input nMOS 621 and pMOS 623 are coupled together is therefore pulled up. Since the gate of output nMOS 641 is coupled to the drains of the input nMOS 621 and pMOS 623, the output nMOS 641 is activated (or turned on), pulling down the voltage at the drain of output nMOS 641, which outputs clkout. As a result, clkout transitions to low to form a falling edge of clkout. Note that the top half of the delay circuit 420 (i.e., the first N-substage 510 and the second P-substage 530) is turned off when clkin transitions from high to low. The falling edge of the output signal clkout is generated by the first P-substage 520 and the second N-substage 540 operating together. By generating the rising edge and the falling edge of clkout separately using distinct parts of the delay circuit 420, the delay circuit 420 can advantageously generate substantially equal rising edge and falling edge. Unlike the conventional inverter-based delay circuit 100 shown in FIG. 1, which may generate unequal rising and falling edges due to PN mismatches, the delay circuit 420 is not susceptible to the effect of PN mismatches in this regard. As discussed above, the second tracking module 560 provides cross-skew corner compensation to the output nMOS 641. Specifically, in the current example, clkin_b transitions from low to high when clkin transitions from high to low. As mentioned above, the gate of pMOS 661 within the second tracking module 560 is configured to receive clkin_b. Thus, pMOS 661 is deactivated (or turned off) in response to clkin_b transitioning to high, blocking current flow from VDD through the nMOS's 665 and 663 to ground. Thus, the node at the drain of the nMOS 663 is pulled down to a low voltage (e.g., substantially ground). Since the gate of the compensation pMOS 643 is coupled to the drain of the nMOS 663, the compensation pMOS 643 is activated (or turned on) by the low voltage to provide cross-skew corner compensation to the output nMOS 641 when the falling edge of clkout is generated. With the cross-skew corner compensation provided by the tracking modules 550 and 560, the delay circuit 420 can be advantageously made substantially insensitive to PVT variations.

In some implementations, the delay circuit 420 includes the duty cycle correction (DCC) module 570 to correct, compensate, or mitigate duty cycle distortion introduced by the delay circuit 420, if any. Note that the DCC module 570 is integrated within the delay circuit 420, and is distinct and separate from the DCC module 320 shown in FIG. 3. Referring to FIG. 6, the DCC module 570 includes an nMOS 671 and a pMOS 673. The nMOS 671 has a drain, a source, and a gate, where the source is coupled to ground, the drain is coupled to the source of nMOS 613 and the drain of nMOS 615 of the first N-substage 510, and the gate is configured to receive vbn. The pMOS 673 also has a drain, a source, and a gate, where the source is coupled to VDD, the drain is coupled to the source of pMOS 623 and the drain of pMOS 625 of the first P-substage 520, and the gate is configured to receive vbp.

In some implementations, the pMOS 673 is tunable, whereas the nMOS 671 remains constant (or unchanged). For example, the pMOS 673 can be implemented using a set of substantially similar pMOS's (not shown to avoid obscuring the drawing) coupled to each other in parallel between the drain of the pMOS 625 and VDD. The bias voltage vbp is applied to the gates of these pMOS's. Furthermore, a selected number of these pMOS's can be turned on (or activated) based on the code, dcc (shown in FIG. 3), in order to tune the amount of total current flowing from VDD to the sources of the pMOS's. The tunable pMOS 673 can adjust current to control the falling edge of the output signal clkout. Note that the rising edge of clkout is not adjusted. Alternatively, the nMOS 671 can be configured to be tunable instead of the pMOS 673, in which case, the rising edge of clkout is adjusted while the falling edge of clkout remains unchanged. For example, the nMOS 671 can be implemented using a set of substantially similar nMOS's (not shown to avoid obscuring the drawing) coupled to each other in parallel between the ground and the drains of the nMOS's. The bias voltage vbn is applied to the gates of these nMOS's. Furthermore, a selected number of these nMOS's can be turned on (or activated) based on a code (similar to dcc in FIG. 3) in order to tune the amount of total current flowing through the nMOS's to ground. By adjusting only one of the falling edge and the rising edge of clkout, race condition between delay and DCC calibration can be removed because they can be independently adjusted through the delay circuit 420. Moreover, the DCC module 570 is integrated within the delay circuit 420, and hence, eliminating the need to provide an additional DCC module external to the delay unit 260 to correct any DCC in clkout from the delay unit 260. Thus, having the DCC module 570 within the delay circuit 420 helps save area and power, while improving performance.

Figure 7:
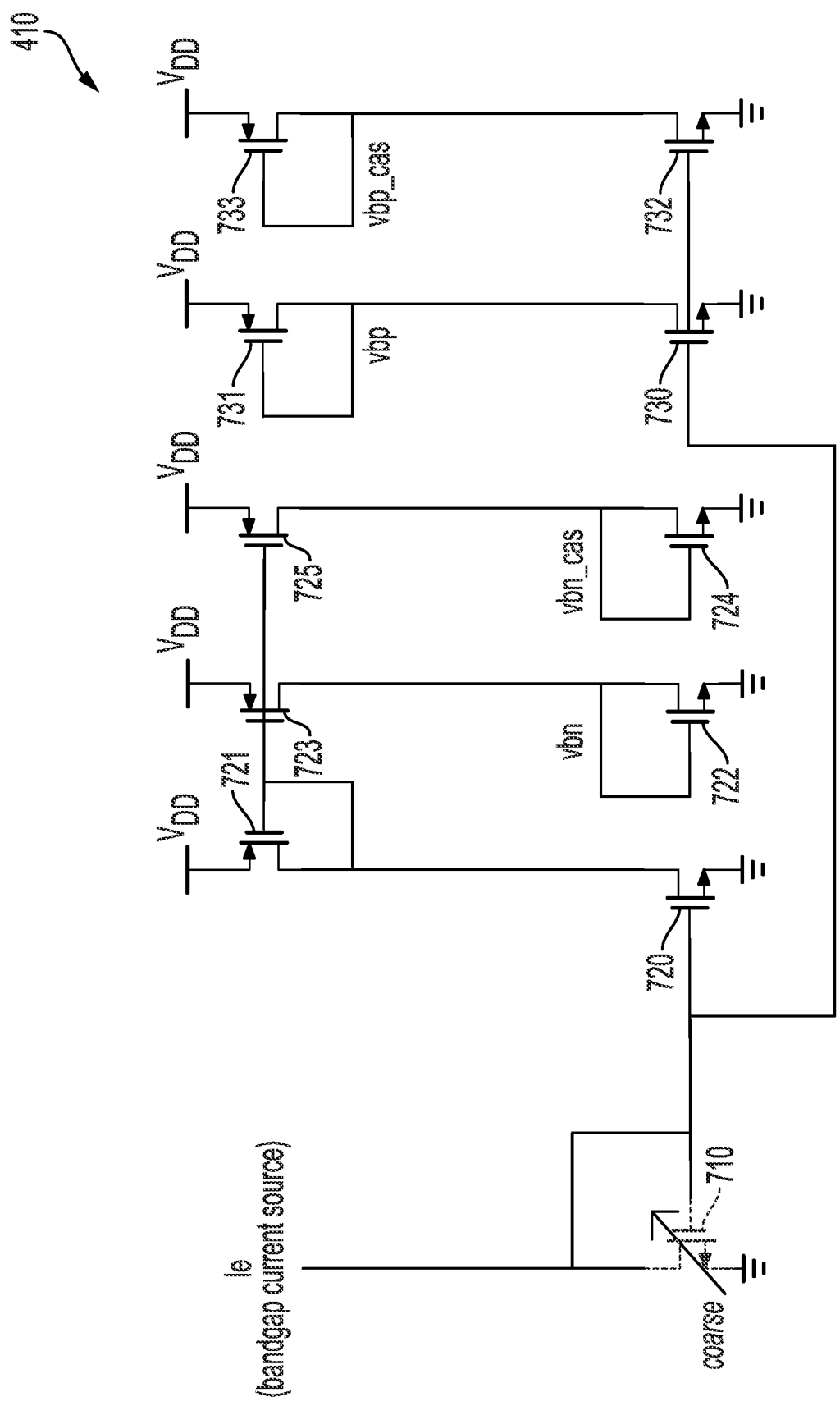
FIG. 7 shows one implementation of a bias voltage generator.

FIG. 7 shows one implementation of the bias voltage generator 410 according to some aspects of the disclosure. As discussed above, the bias voltage generator 410 is configured to generate a set of bias voltages (namely, vbp, vbp_cas, vbn, and vbn_cas) for the delay circuit 420. Referring to FIG. 7, the bias voltage generator 410 includes six (6) nMOS's 710, 720, 722, 724, 730, and 732, and five (5) pMOS's 721, 723, 725, 731, and 733, each of which has a source, a drain, and a gate. The source of nMOS 710 is coupled to ground, and the gate and drain of nMOS 710 are coupled together and configured to receive a bandgap reference current Ie from a bandgap current source. The source of nMOS 720 is also coupled to ground, the gate of nMOS 720 is coupled to the gate of nMOS 710, and the drain of nMOS 720 is coupled to the drain and the gate of pMOS 721. The source of pMOS 721 is coupled to the power supply VDD. The nMOS's 710 and 720 are configured as a current mirror such that the bandgap reference current Ie flowing through the nMOS 710 is mirrored (or replicated) to the nMOS 720 on the other side. Thus, a current substantially the same as Ie flows through the path formed by the nMOS 720 and pMOS 721.

In some implementations, the source of pMOS 723 is also coupled to VDD. The gate of pMOS 723 is coupled to the gate and drain of the pMOS 721. The drain of pMOS 723 is coupled to the drain and gate of nMOS 722. The source of nMOS 722 is coupled to ground. Like pMOS 723, the source of pMOS 725 is also coupled to VDD. The gate of pMOS 725 is coupled to the gate and drain of the pMOS 721. The drain of pMOS 725 is coupled to the drain and gate of nMOS 724. The source of nMOS 724 is coupled to ground. During operation, the pMOS 721 and pMOS 723 are also configured as a current mirror. Thus, the current flowing through pMOS 721 (i.e., Ie) is further mirrored (or replicated) to the path formed by pMOS 723 and nMOS 722. The voltage generated at the drain and gate of nMOS 722 is output as one of the bias voltages, vbn. Likewise, the pMOS 721 and pMOS 725 are also configured as a current mirror. Thus, Ie flowing through pMOS 721 is again mirrored (or replicated) to the path formed by pMOS 725 and nMOS 724. The voltage generated at the drain and gate of nMOS 724 is output as another one of the bias voltages, vbn_cas.

In some implementations, the source of pMOS 731 is coupled to VDD, and the gate and drain of pMOS 731 are coupled together to the drain of nMOS 730. The source of nMOS 730 is coupled to ground and the gate of nMOS 730 is coupled to the gates of both nMOS's 710 and 720. Like pMOS 731, the source of pMOS 733 is coupled to VDD, and the gate and drain of pMOS 733 are coupled together to the drain of nMOS 732. The source of nMOS 732 is coupled to ground and the gate of nMOS 732 is coupled to the gates of both nMOS's 710 and 720. During operation, the nMOS 710 and 730 are configured as a current mirror such that the current Ie flowing through the nMOS 710 is mirrored (or replicated) to the path formed by nMOS 730 and pMOS 731. Thus, a current substantially the same as Ie flows through pMOS 731 and the voltage generated at the gate and drain of pMOS 731 is output as one of the bias voltages, vbp. Likewise, the nMOS 710 and 732 are also configured as a current mirror such that the current Ie flowing through the nMOS 710 is mirrored (or replicated) to the path formed by nMOS 732 and pMOS 733. Thus, a current substantially the same as Ie flows through pMOS 733 and the voltage generated at the gate and drain of pMOS 733 is output as one of the bias voltages, vbp_cas.

In some implementations, the nMOS 710 can be tunable in response to a signal or a code, "coarse" (such as the code, coarse shown in FIGS. 3 and 4). Specifically, the nMOS 710 can be implemented with a set of nMOS's of substantially similar size, coupled to each other in parallel between the drains of the nMOS's and ground. A selected number of the nMOS's can be turned on (activated) based on the code applied to the gates of the nMOS's.

Figure 8:
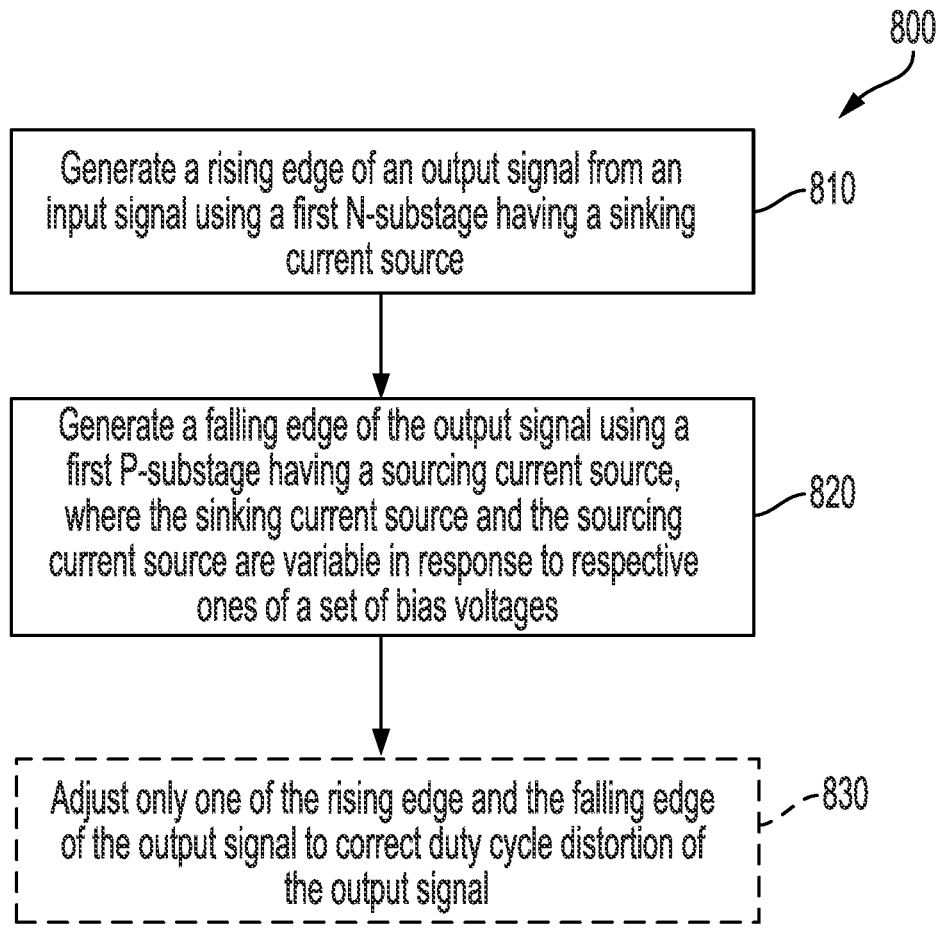
FIG. 8 shows one implementation of a method to generate a delayed version of an input signal.

FIG. 8 shows one implementation of a method 800 to generate a delayed version of an input signal. The method 800 can be practiced using various implementations of the delay circuit 420 discussed above. The method 800 begins at block 810, in which a rising edge of an output signal is generated from the input signal using a first N-substage having a sinking current source. For example, the rising edge can be generated using some implementations of the first N-substage 510 shown in FIGS. 5-6. Then the method 800 transitions to block 820, in which a falling edge of the output signal is generated using a first P-substage having a sourcing current source. For example, the falling edge can be generated using some implementations of the first P-substage 520 shown in FIGS. 5-6. Furthermore, the sinking current source and the sourcing current source are variable (or tunable) in response to respective ones of a set of bias voltages. For example, the bias voltages can be provided by a bias voltage generator, such as some implementations of the bias voltage generator 410 shown in FIGS. 4 and 7.

In some implementations, the method further transitions from block 820 to block 830, in which only one of the rising edge and the falling edge of the output signal is adjusted to correct duty cycle distortion of the output signal. For example, the method 800 can use a duty cycle distortion (DCC) module, such as some implementations of the DCC module 570 shown in FIGS. 5 and 6. In implementations where the falling edge of the output signal is adjusted to correct duty cycle distortion, the DCC module can be implemented with a tunable pMOS (e.g., the tunable pMOS 673 in FIG. 6). Alternatively, in some implementations where the rising edge of the output signal is adjusted to correct duty cycle distortion, the DCC module can be implemented with a tunable nMOS.

It is to be appreciated that the present disclosure is not limited to the exemplary terminology used above to describe aspects of the present disclosure. For example, a delay device may also be referred to as a delay stage, a delay buffer, a delay element, or another term. A quadrature clock generator may also be referred to as a clock generator or another term. A clock may be referred to as a clock signal, a timing signal, or another term.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

Some implementation examples are described in the following numbered clauses:

1. A delay circuit, comprising: a first N-substage having a sinking current source, configured to receive an input signal and to generate a rising edge of an output signal of the delay circuit, wherein the output signal is a delayed version of the input signal; and a first P-substage having a sourcing current source, configured to receive the input signal and to generate a falling edge of the output signal, where the sinking current source and the sourcing current source are variable in response to respective ones of a plurality of bias voltages.

2. The delay circuit of clause 1, further comprising a duty cycle correction module coupled to the first N-substage and the first P-substage, configured to adjust only one of the rising edge and the falling edge of the output signal to correct duty cycle distortion of the output signal.

3. The delay circuit of clause 2, wherein the duty cycle correction module comprises: a set of p-type metal oxide semiconductor devices (pMOS's), each having a drain, a gate, and a source, the drain coupled to the first P-substage, the source coupled to a voltage supply (VDD), and the gate configured to receive a first one of the plurality of bias voltages (Vbp); and a set of n-type metal oxide semiconductor devices (nMOS's), each having a drain, a gate, and a source, the drain coupled to the first N-substage, the source coupled to ground, and the gate configured to receive a second one of the plurality of bias voltages (Vbn).

4. The delay circuit of clause 3, wherein the set of pMOS's of the duty cycle correction module is configured to be tunable to adjust the falling edge of the output signal, and the set of nMOS's of the duty cycle correction module is configured to remain constant.

5. The delay circuit of clause 3, wherein the set of nMOS's of the duty cycle correction module is configured to be tunable to adjust the rising edge of the output signal, and the set of pMOS's of the duty cycle correction module is configured to remain constant.

6. The delay circuit of clause 1, further comprising: a second N-substage having a first input coupled to the first P-substage, and an output coupled to an output of the delay circuit to provide the falling edge of the output signal of the delay circuit; and a second P-substage having a first input coupled to the first N-substage, and an output coupled to the output of the delay circuit to provide the rising edge of the output signal of the delay circuit.

7. The delay circuit of clause 6, wherein the second P-substage comprises: an output pMOS having a source, a gate, and a drain, the source of the output pMOS coupled to a voltage supply (VDD), the drain coupled to an output of the delay circuit, and the gate coupled to the first N-substage; and a compensation NMOS having a gate, a source, and a drain, the drain coupled to the voltage supply (VDD), the source coupled to the output of the delay circuit, and the gate coupled to a first tracking module.

8. The delay circuit of clause 7, wherein the first tracking module comprises a second sourcing current source, substantially similar to the sourcing current source of the first P-substage, and an nMOS having a gate, a source, and a drain, the source coupled to ground, the drain coupled to the second sourcing current source, and the gate configured to receive a complementary version of the input signal.

9. The delay circuit of clause 8, wherein the second N-substage comprises: an output nMOS having a source, a gate, and a drain, the source coupled to ground, the drain coupled to the output of the delay circuit, and the gate coupled to the first P-substage; and a compensation pMOS having a gate, a source, and a drain, the drain coupled to ground, the source coupled to the output of the delay circuit, and the gate coupled to a second tracking module.

10. The delay circuit of clause 9, wherein the second tracking module comprises a second sinking current source, substantially similar to the sinking current source of the first N-substage, and a pMOS having a gate, a source, and a drain, the source coupled to the voltage supply (VDD), the drain coupled to the second sinking current source, and the gate configured to receive the complementary version of the input signal.

11. The delay circuit of clause 1, wherein the plurality of bias voltages are generated from a bandgap reference current.

12. A system on a chip (SoC), comprising: a processing module; and an input interface, coupled to the processing module, configured to receive input signals from a source external to the SoC, the input interface comprising a quadrature clock generator, the quadrature clock generator comprising a delay circuit as recited in clause 1.

13. The system of clause 12, wherein the quadrature clock generator further comprises: a single end to differential converter coupled to the delay circuit to receive the delayed version of the clock signal and to generate a pair of complementary clock signals based on the delayed version of the clock signal; and a phase interpolator coupled to the single end to differential converter to receive the pair of complementary clock signals.

14. A method to generate a delayed version of an input signal, comprising: generating a rising edge of an output signal from the input signal using a first N-substage having a sinking current source, wherein the output signal is the delayed version of the input signal; and generating a falling edge of the output signal using a first P-substage having a sourcing current source, where the sinking current source and the sourcing current source are variable in response to respective ones of a plurality of bias voltages.

15. The method of clause 14, further comprising: adjusting only one of the rising edge and the falling edge of the output signal to correct duty cycle distortion of the output signal.

16. The method of clause 14, further comprising: providing the falling edge of the output signal using a second N-substage, the second N-substage having a first input coupled to the first P-substage, and an output coupled to an output of the delay circuit; and providing the rising edge of the output signal using a second P-substage, the second P-substage having a first input coupled to the first N-substage, and an output coupled to the output of the delay circuit.

17. The method of clause 16, wherein the second P-substage comprises an output PMOS having a source, a gate, and a drain, the source of the output PMOS coupled to a voltage supply (VDD), the drain coupled to an output of the delay circuit, and the gate coupled to the first N-substage; and the method further comprises: providing cross-skew compensation to the rising edge of the output signal using a compensation NMOS driven by a first tracking module, wherein the compensation NMOS has a gate, a source, and a drain, the drain coupled to the voltage supply (VDD), the source coupled to the output of the delay circuit, and the gate coupled to the first tracking module.

18. The method of clause 17, wherein the second N-substage comprises an output NMOS having a source, a gate, and a drain, the source of the output NMOS coupled to ground, the drain coupled to the output of the delay circuit, and the gate coupled to the first P-substage; and the method further comprises: providing cross-skew compensation to the falling edge of the output signal using a compensation PMOS driven by a second tracking module, wherein the compensation PMOS has a gate, a source, and a drain, the drain coupled to the ground, the source coupled to the output of the delay circuit, and the gate coupled to the second tracking module.

19. The method of clause 14, further comprising: generating the plurality of bias voltages from a bandgap reference current source.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A delay circuit, comprising:
a first N-substage having a sinking current source, configured to receive an input signal and to generate a rising edge of an output signal of the delay circuit, wherein the output signal is a delayed version of the input signal;
a first P-substage having a sourcing current source, configured to receive the input signal and to generate a falling edge of the output signal, where the sinking current source and the sourcing current source are variable in response to respective ones of a plurality of bias voltages; and
a duty cycle correction module coupled to the first N-substage and the first P-substage, configured to adjust only one of the rising edge and the falling edge of the output signal to correct duty cycle distortion of the output signal.

2. The delay circuit of claim 1, wherein the duty cycle correction module comprises:
a set of p-type metal oxide semiconductor devices (pMOS's), each having a drain, a gate, and a source, the drain coupled to the first P-substage, the source coupled to a voltage supply (VDD), and the gate configured to receive a first one of the plurality of bias voltages (Vbp); and
a set of n-type metal oxide semiconductor devices (nMOS's), each having a drain, a gate, and a source, the drain coupled to the first N-substage, the source coupled to ground, and the gate configured to receive a second one of the plurality of bias voltages (Vbn).

3. The delay circuit of claim 2, wherein the set of pMOS's of the duty cycle correction module is configured to be tunable to adjust the falling edge of the output signal, and the set of nMOS's of the duty cycle correction module is configured to remain constant.

4. The delay circuit of claim 2, wherein the set of nMOS's of the duty cycle correction module is configured to be tunable to adjust the rising edge of the output signal, and the set of pMOS's of the duty cycle correction module is configured to remain constant.

5. A delay circuit, comprising:
a first N-substage having a sinking current source, configured to receive an input signal and to generate a rising edge of an output signal of the delay circuit, wherein the output signal is a delayed version of the input signal;
a first P-substage having a sourcing current source, configured to receive the input signal and to generate a falling edge of the output signal, where the sinking current source and the sourcing current source are variable in response to respective ones of a plurality of bias voltages;
a second N-substage having a first input coupled to the first P-substage, and an output coupled to an output of the delay circuit to provide the falling edge of the output signal of the delay circuit; and
a second P-substage having a first input coupled to the first N-substage, and an output coupled to the output of the delay circuit to provide the rising edge of the output signal of the delay circuit.

6. The delay circuit of claim 5, wherein the second P-substage comprises:
an output pMOS having a source, a gate, and a drain, the source of the output pMOS coupled to a voltage supply (VDD), the drain coupled to an output of the delay circuit, and the gate coupled to the first N-substage; and
a compensation NMOS having a gate, a source, and a drain, the drain coupled to the voltage supply (VDD), the source coupled to the output of the delay circuit, and the gate coupled to a first tracking module.

7. The delay circuit of claim 6, wherein the first tracking module comprises a second sourcing current source, substantially similar to the sourcing current source of the first P-substage, and an nMOS having a gate, a source, and a drain, the source coupled to ground, the drain coupled to the second sourcing current source, and the gate configured to receive a complementary version of the input signal.

8. The delay circuit of claim 7, wherein the second N-substage comprises:
an output nMOS having a source, a gate, and a drain, the source coupled to ground, the drain coupled to the output of the delay circuit, and the gate coupled to the first P-sub stage; and
a compensation pMOS having a gate, a source, and a drain, the drain coupled to ground, the source coupled to the output of the delay circuit, and the gate coupled to a second tracking module.

9. The delay circuit of claim 8, wherein the second tracking module comprises a second sinking current source, substantially similar to the sinking current source of the first N-substage, and a pMOS having a gate, a source, and a drain, the source coupled to the voltage supply (VDD), the drain coupled to the second sinking current source, and the gate configured to receive the complementary version of the input signal.

10. The delay circuit of claim 1, wherein the plurality of bias voltages are generated from a bandgap reference current.

11. A system on a chip (SoC), comprising:
a processing module; and
an input interface, coupled to the processing module, configured to receive input signals from a source external to the SoC, the input interface comprising a quadrature clock generator, the quadrature clock generator comprising
a delay circuit as claimed in claim 1.

12. The system of claim 11, wherein the quadrature clock generator further comprises:
a single end to differential converter coupled to the delay circuit to receive the delayed version of the clock signal and to generate a pair of complementary clock signals based on the delayed version of the clock signal; and
a phase interpolator coupled to the single end to differential converter to receive the pair of complementary clock signals.

13. A method to generate a delayed version of an input signal, comprising:
generating a rising edge of an output signal from the input signal using a first N-substage having a sinking current source, wherein the output signal is the delayed version of the input signal;
generating a falling edge of the output signal using a first P-substage having a sourcing current source, where the sinking current source and the sourcing current source are variable in response to respective ones of a plurality of bias voltages; and
adjusting only one of the rising edge and the falling edge of the output signal to correct duty cycle distortion of the output signal.

14. The method of claim 13, further comprising:
providing the falling edge of the output signal using a second N-substage, the second N-substage having a first input coupled to the first P-substage, and an output coupled to an output of the delay circuit; and providing the rising edge of the output signal using a second P-substage, the second P-substage having a first input coupled to the first N-substage, and an output coupled to the output of the delay circuit.

15. The method of claim 14, wherein the second P-substage comprises an output PMOS having a source, a gate, and a drain, the source of the output PMOS coupled to a voltage supply (VDD), the drain coupled to an output of the delay circuit, and the gate coupled to the first N-substage; and the method further comprises:

providing cross-skew compensation to the rising edge of the output signal using a compensation NMOS driven by a first tracking module, wherein the compensation NMOS has a gate, a source, and a drain, the drain coupled to the voltage supply (VDD), the source coupled to the output of the delay circuit, and the gate coupled to the first tracking module.

16. The method of claim 15, wherein the second N-substage comprises an output NMOS having a source, a gate, and a drain, the source of the output NMOS coupled to ground, the drain coupled to the output of the delay circuit, and the gate coupled to the first P-substage; and the method further comprises:

providing cross-skew compensation to the falling edge of the output signal using a compensation PMOS driven by a second tracking module, wherein the compensation PMOS has a gate, a source, and a drain, the drain coupled to the ground, the source coupled to the output of the delay circuit, and the gate coupled to the second tracking module.

17. The method of claim 13, further comprising:

generating the plurality of bias voltages from a bandgap reference current source.

* * * * *